US008726124B2

(12) United States Patent
Hill et al.

(10) Patent No.: US 8,726,124 B2
(45) Date of Patent: May 13, 2014

(54) CYCLIC REDUNDANCY CHECK GENERATION VIA DISTRIBUTED TIME MULTIPLEXED LINEAR FEEDBACK SHIFT REGISTERS

(75) Inventors: Eric Lyell Hill, Palo Alto, CA (US); Richard L. Schober, Jr., Cupertino, CA (US); Hungse Cha, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/553,583

(22) Filed: Jul. 19, 2012

(65) Prior Publication Data

US 2014/0026021 A1    Jan. 23, 2014

(51) Int. Cl.
*H03M 13/00* (2006.01)
(52) U.S. Cl.
USPC ............................. 714/758; 714/763; 714/801
(58) Field of Classification Search
USPC ......................................... 714/758, 763, 801
See application file for complete search history.

(56) References Cited

U.S. PATENT DOCUMENTS

| 8,020,069 | B1 | 9/2011 | Feng | |
|---|---|---|---|---|
| 2002/0174399 | A1 | 11/2002 | Keller | |
| 2004/0193993 | A1 | 9/2004 | Roy | |
| 2005/0172205 | A1* | 8/2005 | Lin et al. | 714/758 |
| 2007/0162823 | A1* | 7/2007 | Lin et al. | 714/758 |
| 2007/0266301 | A1 | 11/2007 | Bawankule | |
| 2009/0282148 | A1* | 11/2009 | Wong et al. | 709/226 |
| 2010/0185926 | A1* | 7/2010 | Lawson et al. | 714/807 |
| 2011/0239097 | A1* | 9/2011 | Bates et al. | 714/807 |
| 2012/0144277 | A1 | 6/2012 | Lee | |
| 2012/0192044 | A1* | 7/2012 | Shafai et al. | 714/807 |

OTHER PUBLICATIONS

Kevin Richardson, John A. Hamilton, Jr., and Martin C. Carlisle. 2007. A performance analysis of the spring protocol through simulation. In Proceedings of the 2007 spring simulation multiconference—vol. 3 (SpringSim '07), vol. 3. Society for Computer Simulation International, San Diego, CA, USA, 356-361.*
Albertengo, G.; Sisto, R.; , "Parallel CRC generation," Micro, IEEE, vol. 10, No. 5, pp. 63-71, Oct. 1990.*
Zubia et al., "Design and Performance of Active Coupler for Plastic Optical Fibres", Jan. 17, 2002, vol. 38, No. 2.
Doering et al, "Fast and Flexible CRC Calculation", Jan. 2, 2004, vol. 40, No. 1.
Non-Final Office Action dated Dec. 6, 2012 for U.S. Appl. No. 13/553,619.

* cited by examiner

*Primary Examiner* — Cynthia Britt
(74) *Attorney, Agent, or Firm* — Patterson + Sheridan, LLP (57) ABSTRACT

Cyclic redundancy check (CRC) values are efficiently calculated using an improved linear feedback shift register (LFSR) circuit. CRC value generation is separated into two sub-calculations, which are then combined to form a final CRC value. A programmable XOR engine performs logic functions via a table lookup rather than via a random logic circuit. LCRC and ECRC calculations are performed using a single shared LFSR circuit. Multiple links share the same CRC value generator. One advantage of the present invention is that CRC values are generated using smaller and fewer LFSR circuits relative to conventional circuit designs. As a result, a CRC value generator utilizing the disclosed techniques consumes less surface area of an integrated circuit and consumes less power, resulting in cooler operation.

20 Claims, 9 Drawing Sheets

CYCLIC REDUNDANCY CHECK GENERATION VIA DISTRIBUTED TIME MULTIPLEXED LINEAR FEEDBACK SHIFT REGISTERS

BACKGROUND OF THE INVENTION

1. Field of the Invention

The present invention generally relates to data transfer within a computing environment and, more particularly, to cyclic redundancy check generation via distributed time multiplexed linear feedback shift registers.

2. Description of the Related Art

In modern computing environments, multiple devices are oftentimes interconnected to provide processing speed and flexibility within the computing environment. In such architectures, data exchanged between the interconnected devices is susceptible to corruption due to intermittent noise or other interruptions during transmission of the data from the source device to the receiving device. To detect such corruption, some computing environments employ a technique whereby a calculation is performed on the data to be transmitted, and the result of the calculation is transmitted by the source device along with the data. The receiving device performs the same calculation on the data when received and compares the value calculated by the receiving device with the transmitted value calculated by the source device. The two calculations being identical indicates that the data has been transmitted successfully. The two calculations being different indicates that the data has been corrupted, thereby causing the receiving device sends a request to the source device to retransmit the data packet.

One such technique is known as a cyclic redundancy check (CRC). Using the CRC technique, the source device and receiving device perform a function on the transmitted data that resembles long division. The result of the function is transmitted by the source device as a check value along with the data, and the receiving device compares the received check value with the computed check value. The check value is typically computed by using a linear feedback shift register (LFSR). LFSR circuits are relatively easy to implement in hardware, and reliably detect corruptions in transmitted data.

As computing environments have evolved, data is transmitted over channels using more binary digits (bits) per data word. LFSR designs increase in complexity and physical size as a function of the number of bits per data word. As a result, the LFSR circuit consumes more space as the number of bits per data word increases. In one example, the number of bits per data word defined by PCI Express™ (PCIe) 3.0 has doubled as compared to PCIe 2.0, while the hardware surface area for the LFSR to implement CRC has increased 3.6 times in size.

In addition to this problem, some communication protocols define multiple CRC values to be computed by a source device and receiving device, resulting in multiple LFSR circuits for each source device and receiving device. Complex devices may have multiple source devices and receiving devices, each needing one or more LFSR circuits to implement CRC. Thus, computing devices need larger and multiple LFSR circuits to ensure reliable data transmission. As a result, a significant portion of the surface area and the power consumed on an integrated circuit that implements a source device or receiving device are associated with LFSR circuits.

As the foregoing illustrates, what is needed in the art is a more efficient technique to ensure reliable data transfers within a computing environment.

SUMMARY OF THE INVENTION

One embodiment of the present invention sets forth a computer-implemented method for generating cyclic redundancy check (CRC) values. The method includes selecting a first data word from a plurality of data words associated with a data packet, determining a first partial CRC value for the first data word based on an initial seed value of zero, and determining a second partial CRC value for a predetermined seed value based on the number of bits within the first data word. The method further includes performing an operation on the first partial CRC value and the second partial CRC value to determine a first composite CRC value.

Other embodiments include, without limitation, a subsystem that includes a CRC value generator configured to implement one or more aspects of the disclosed methods as well as a computing device configured to implement one or more aspects of the disclosed methods.

One advantage of the present invention is that CRC values are generated using smaller and fewer LFSR circuits relative to conventional circuit designs. As a result, a CRC value generator utilizing the disclosed techniques consumes less surface area of an integrated circuit and consumes less power, resulting in cooler operation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
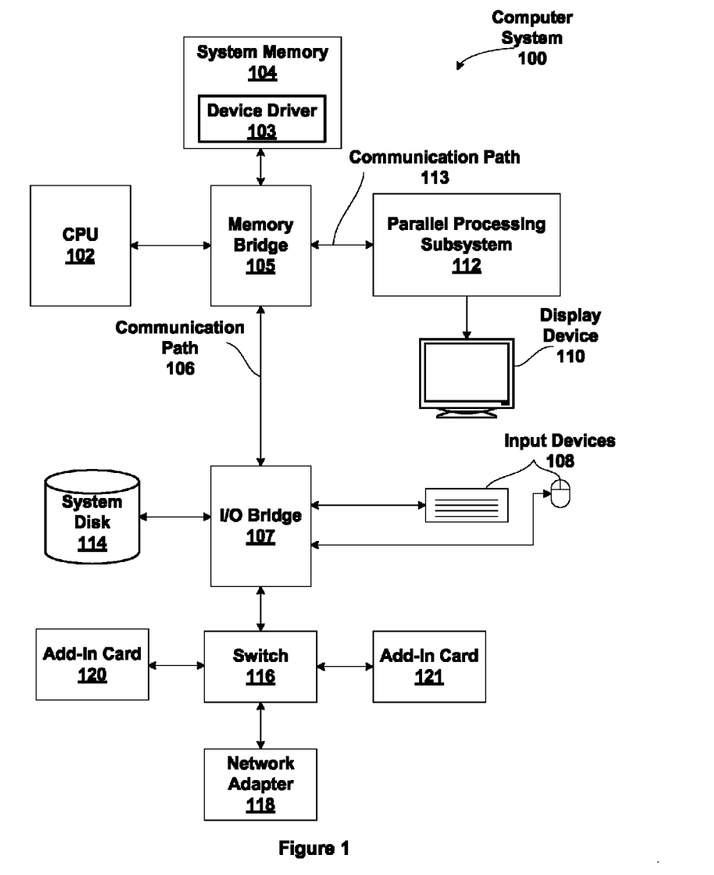
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 communicating via an interconnection path that may include a memory bridge 105. Memory bridge 105, which may be, e.g., a Northbridge chip, is connected via a bus or other communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse) and forwards the input to CPU 102 via communication path 106 and memory bridge 105. A parallel processing subsystem 112 is coupled to memory bridge 105 via a bus or second communication path 113 (e.g., a Peripheral Component Interconnect (PCI) Express, Accelerated Graphics Port, or HyperTransport link); in one embodiment parallel processing subsystem 112 is a graphics subsystem that delivers pixels to a display device 110 that may be any conventional cathode ray tube, liquid crystal display, light-emitting diode display, or the like. A system disk 114 is also connected to I/O bridge 107 and may be configured to store content and applications and data for use by CPU 102 and parallel processing subsystem 112. System disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices.

A switch 116 provides connections between I/O bridge 107 and other components such as a network adapter 118 and various add-in cards 120 and 121. Other components (not explicitly shown), including universal serial bus (USB) or other port connections, compact disc (CD) drives, digital versatile disc (DVD) drives, film recording devices, and the like, may also be connected to I/O bridge 107. The various communication paths shown in FIG. 1, including the specifically named communication paths 106 and 113 may be implemented using any suitable protocols, such as PCI Express, AGP (Accelerated Graphics Port), HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements in a single subsystem, such as joining the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip instead of existing as one or more discrete devices. Large embodiments may include two or more CPUs 102 and two or more parallel processing subsystems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

When data packets, sometimes known as transaction layer packets or TLPs, are transmitted across the bus or second communication path 113 of the computer system 100, certain conditions such as noise may detrimentally affect the transmission. As a result, one or more of the data words within the data packet may be unintentionally corrupted during the transmission. In order to detect data corruption, the source device includes an error detection word, such as a cyclic redundancy check (CRC) value, along with the data words. The CRC value is computed as a function of the data packet including data words intended for the receiving device and other data such as header information, where header information includes, without limitation, the type of data packet, address where the data is stored at the receiving device, and a sequence number that identifies the order sequence of the data packets. A block diagram of a circuit configured to compute such CRC values is described below.

Figure 2:
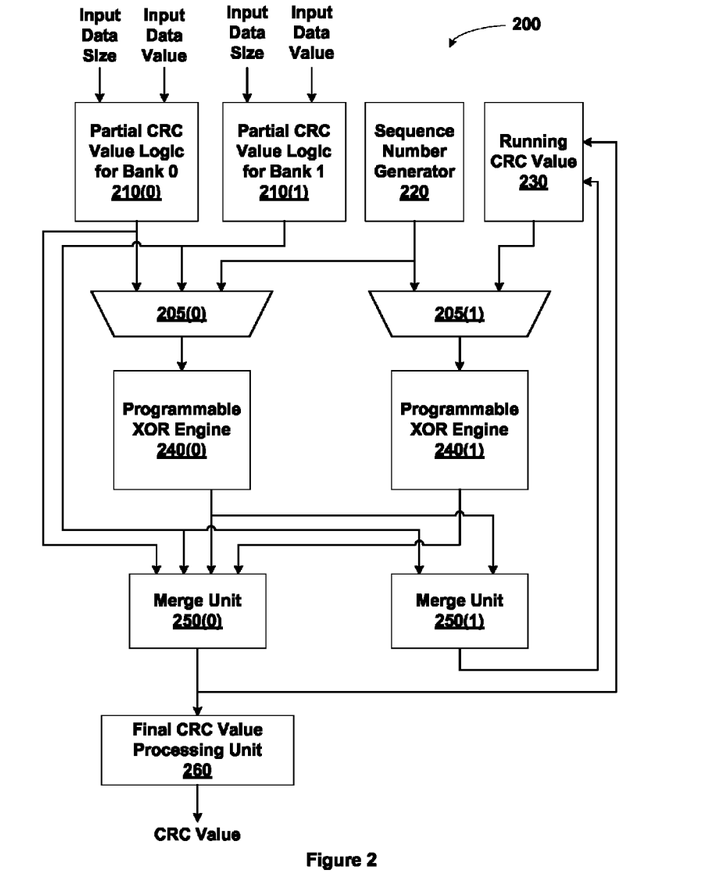
FIG. 2 is a block diagram of a CRC value generator for the bus or second communication path of the computer system of FIG. 1, according to one embodiment of the present invention.

FIG. 2 is a block diagram of a CRC value generator 200 for the bus or second communication path 113 of the computer system 100 of FIG. 1, according to one embodiment of the present invention. As shown, the CRC value generator 200 includes partial CRC value logic 210, a sequence number generator 220, a running CRC value 230, multiplexers 205, programmable XOR engines 240, merge units 250, and a final CRC value processing unit 260.

The partial CRC value logic 210 computes a partial CRC value based on incoming data. Typically, CRC values are calculated using a linear feedback shift register defined by a polynomial. The polynomial indicates multiple bit positions within a data word that are sent to an exclusive or (XOR) circuit, along with the input data, to compute the partial CRC value. As is further described below in conjunction with FIG. 3, the partial CRC value logic 210 takes advantage of the fact that performing a polynomial-based LFSR function on a data input value provides the same result as performing the same LFSR function on the data input value preceded by any number of leading zeros. Therefore, the partial CRC value logic 210 is configured to calculate a CRC value for data input values that include any number of bits up to and including the number of bits in the data path of the partial CRC value logic 210.

In at least one embodiment, the CRC value generator 200 includes multiple blocks of partial CRC value logic 210. For example, the bus or second communication path 113 could be configured to transmit data words up to and including 64-bits, while each of the blocks of partial CRC value logic 210 could be configured to process up to 32-bits at a time. In such a case, a portion of the input data value would be sent to the partial CRC value logic for bank 0 210(0). The remaining portion of the input data value would be sent to the partial CRC value logic for bank 1 210(1). The output of the partial CRC value generators 210 are connected to the multiplexers 205 and the merge units 250.

The sequence number generator 220 is a counter that increments with each data packet processed via the bus or second communication channel 113. In some bus protocols, data packets are identified by a sequence number. Sequence numbers provide a way for a source device and a receiving device to uniquely identify specific data packets, such as when a receiving device requests retransmission of a data packet that has been corrupted. In one example, PCI Express defines a 12-bit sequence number, where each source device maintains a sequence number generator 220 that has a counting range of 0 through 4095. When the CRC value generator 200 transmits a data packet with sequence number 4095, the sequence number generator 220 resets to 0 and begins a new counting sequence.

The running CRC value 230 is a storage register that stores interim CRC values as the CRC value is being calculated for a given data packet. The CRC value generator 200 calculates the CRC value for a given data packet one data word at a time as each data word is received. The CRC value generator 200 merges the CRC value calculation for the current data word with the CRC value calculation for prior data words and stores the result in the running CRC value 230. Once a data packet has been processed, the CRC value generator 200 initialized the running CRC value 230 with a starting value prior to processing the next data packet, as defined by the protocol for the bus or second communication channel 113. The running CRC value receives the output of the merge units 250 and sends the output to the multiplexers 205.

The multiplexers 205 select inputs for the programmable XOR engines 240. The final CRC value is a combination of the CRC values for the various header, data word, and sequence number components within a data packet. The CRC value generator 200 selects each of these components for processing by controlling the multiplexers. In one example, the CRC value generator 200 could include two multiplexers 205(0) 205(1). Multiplexer 205(0) would select the output of the partial CRC value logic for bank 0 210(0), the partial CRC value logic for bank 1 210(1), or the sequence number generator 220. The multiplexer 205(0) would route the selected input to the input of the programmable XOR engine 240(0). Multiplexer 205(1) would select the output of the sequence number generator 220 or the running CRC value 230. The multiplexer 205(1) would route the selected input to the input of the programmable XOR engine 240(1). The multiplexers 205, thereby, would select inputs for the programmable XOR engine 240(0) and the programmable XOR engine 240(1), respectively.

The programmable XOR engines 240 calculate a CRC value for the input value and send the resulting CRC values to the merge units 250. As is further described below in conjunction with FIG. 4, the programmable XOR engines 240 utilize a lookup table to calculate CRC values for certain fixed portions of the data packets. Such fixed portions include, without limitation, the header information for a data packet including the sequence number, and the seed value corresponding to an input data value shifted by a predetermined number of bits. The programmable XOR engines 240 may pass the CRC value from the lookup to table to the output. Alternatively, the programmable XOR engines 240 may perform an XOR of the incoming data with the value from the lookup table and send the result to the output. The programmable XOR engines 240 receive an input value from the multiplexers 205 and send the output of the CRC calculation to the merge units 250.

The merge units 250 perform additional masking and XOR operations on input values received from other blocks within the CRC value generator 200. The CRC value for a given data packet depends on all words to be transmitted as part of the data packet including, without limitation, the header data, the sequence number, the payload data bytes, and the values from the lookup table within the programmable XOR engines 240. As the CRC value for a data packet is computed, the merge units either pass a data value presented on an input to the output of the merge unit 250, or perform an XOR on two data values presented on the inputs of the merge units 250. The merge units receive inputs from the partial CRC value logic 210 and from the programmable XOR engines 240. During each cycle of CRC value calculation, interim results from the merge units 250 are routed to the running CRC value 230. As described above, the running CRC value 23-0 stores interim CRC results as the CRC value is calculated for a given data packet. After the CRC value calculation is complete, the merge unit 250(0) sends the CRC value to the final raw CRC value processing unit 260.

The final CRC value processing unit 260 completes the last steps for calculating the CRC value as defined by the protocol utilized by the bus or second communication channel 113. In one example, the protocol could define the transmitted CRC value as a bitwise inversion of the raw CRC value received from the merge unit 250(0). In another example, the protocol could define the transmitted CRC value to be the raw CRC value from the merge unit 250(0) presented in reverse byte order. In such a case, the final CRC value processing unit 260 would perform the inversion or byte order reversal to calculate the final CRC value. The final CRC value processing unit 260 receives the output of the merge unit 250(0) and outputs the final CRC value from the CRC value generator 200.

The partial CRC value logic 210 and the mask and programmable XOR engines 240 of FIG. 2 are more fully described below in conjunction with FIGS. 3 and 4 respectively.

Figure 3:
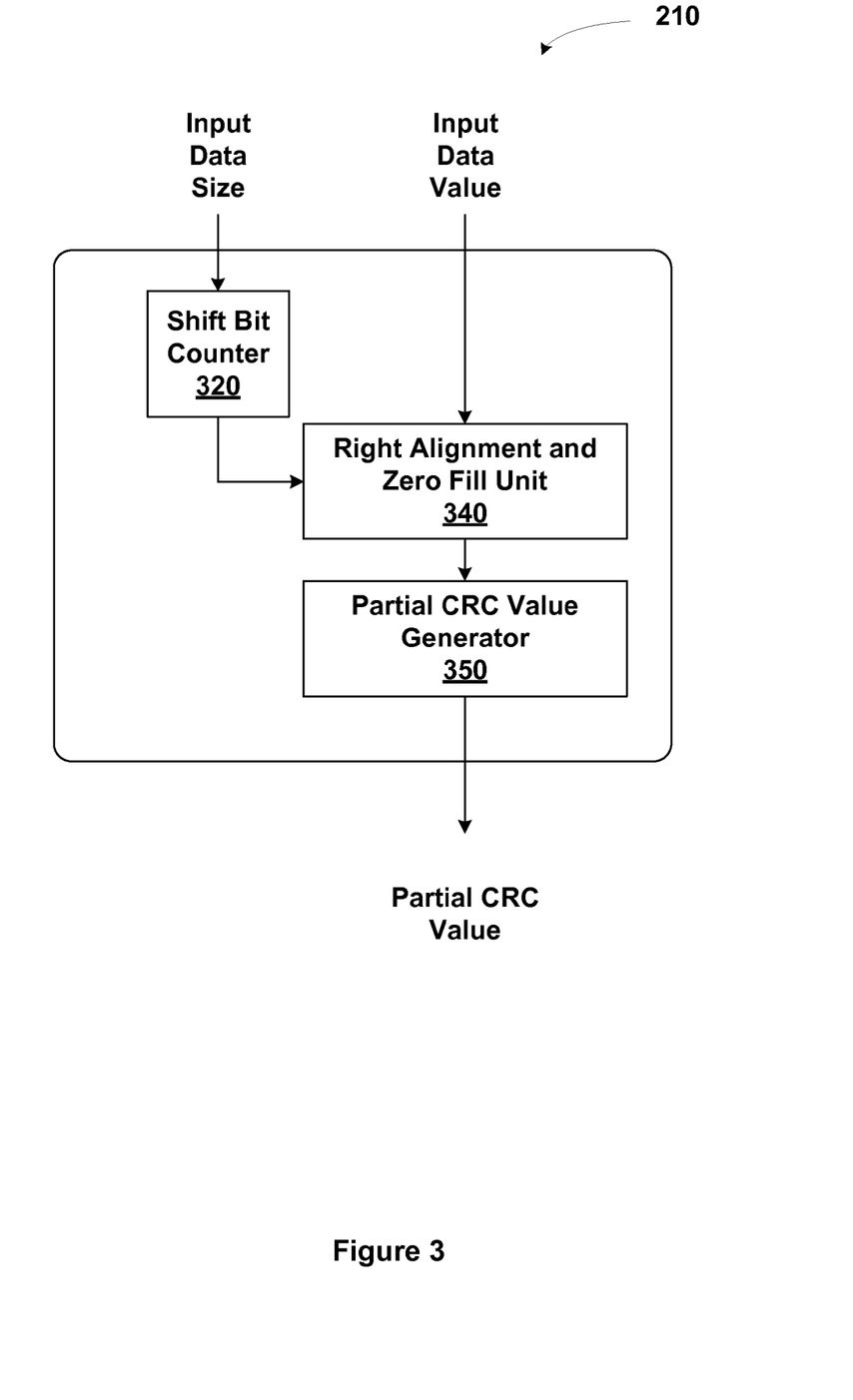
FIG. 3 is a block diagram of the partial CRC value logic for the CRC value generator of FIG. 2, according to one embodiment of the present invention.

FIG. 3 is a block diagram of the partial CRC value logic 210 for the CRC value generator 200 of FIG. 2, according to one embodiment of the present invention. As shown, the CRC logic circuit 210 includes a shift bit counter 320, a right alignment and zero fill unit 340, and a partial CRC value generator 350.

The shift bit counter 320 is a circuit that determines the number of bit positions to shift the input data value based on the input data size. In one example, the partial CRC value logic could be configured to receive left-aligned input data values that include up to 32-bits. If a particular input data value is 32 bits wide, then the value is not shifted, and the shift bit counter 320 provides an output of 0. If a particular input data value is less than 32-bits wide, then the value would right-shifted to right-align the significant bits of input data value. In one example, the input data value could be 16 bits wide presented on the left 16 bits of the 32-bit input of the partial CRC value logic 210. The shift bit counter 320 would receive an indicator that the input data value is 16 bits wide, and would initialize a counter to 16. The shift bit counter 320 would be decremented once for each right shift of the data input value until the shift bit counter 320 reaches zero. The data input value would then be right-aligned. In another example, the input data value could be 8 bits wide presented on the left 8 bits of the 32-bit input of the partial CRC value logic 210. The shift bit counter 320 would receive an indicator that the input data value is 8 bits wide, and would initialize a counter to 24. The shift bit counter 320 would be decremented once for each right shift of the data input value until the shift bit counter 320 reaches zero. The data input value would then be right-aligned. The shift bit counter 320 receives an indicator of the data input size and sends a counter value to the right alignment and zero fill unit 340.

The right alignment and zero fill unit 340 performs the right-alignment of the data input value. The right alignment and zero fill unit 340 receives and stores the input data value. If the number of bits input data value is equal to the number of bits in the data path of the partial CRC value logic 210, then the right alignment and zero fill unit 340 receives a value of 0 from the shift bit counter 320. In such a case, the right alignment and zero fill unit 340 performs no shift of the data input value.

If the number of bits input data value is less than the number of bits in the data path of the partial CRC value logic 210, then the right alignment and zero fill unit 340 receives a value from the shift bit counter 320 representing the number of bits to right-shift the input data value. In such a case, the right alignment and zero fill unit 340 shifts the data input value one bit to the right for each count of the shift bit counter 320 until the shift bit counter 320 reaches zero. At each right-shift, a value of 0 is shifted into the leftmost bit position of the right alignment and zero fill unit 340. In this manner, the data input value is right-aligned to the data path of the partial CRC value logic 210, and the non-significant bits of the data path are filled with zero.

The partial CRC value generator 350 calculates a CRC value for the input data value, as right-shifted and zero filled by the right alignment and zero fill unit 340. The partial CRC value generator 350 is typically a polynomial-based LFSR implemented by techniques known in the art, including, without limitation, a multi-tap shift register, or an array of XOR gates to perform the LFSR calculation as a parallel operation. The partial CRC value generator 350 receives the output of the right alignment and zero fill unit 340 and provides the partial CRC value as the output of the partial CRC value logic 210.

The technique described in conjunction with FIG. 3 takes advantage of the fact that performing a polynomial-based LFSR function on a data input value provides the same result as performing the same LFSR function on the data input value preceded by any number of leading zeros. Therefore, the partial CRC value logic 210 is configured to calculate a CRC value for data input values that include any number of bits up to and including the number of bits in the data path of the partial CRC value logic 210.

Figure 4:
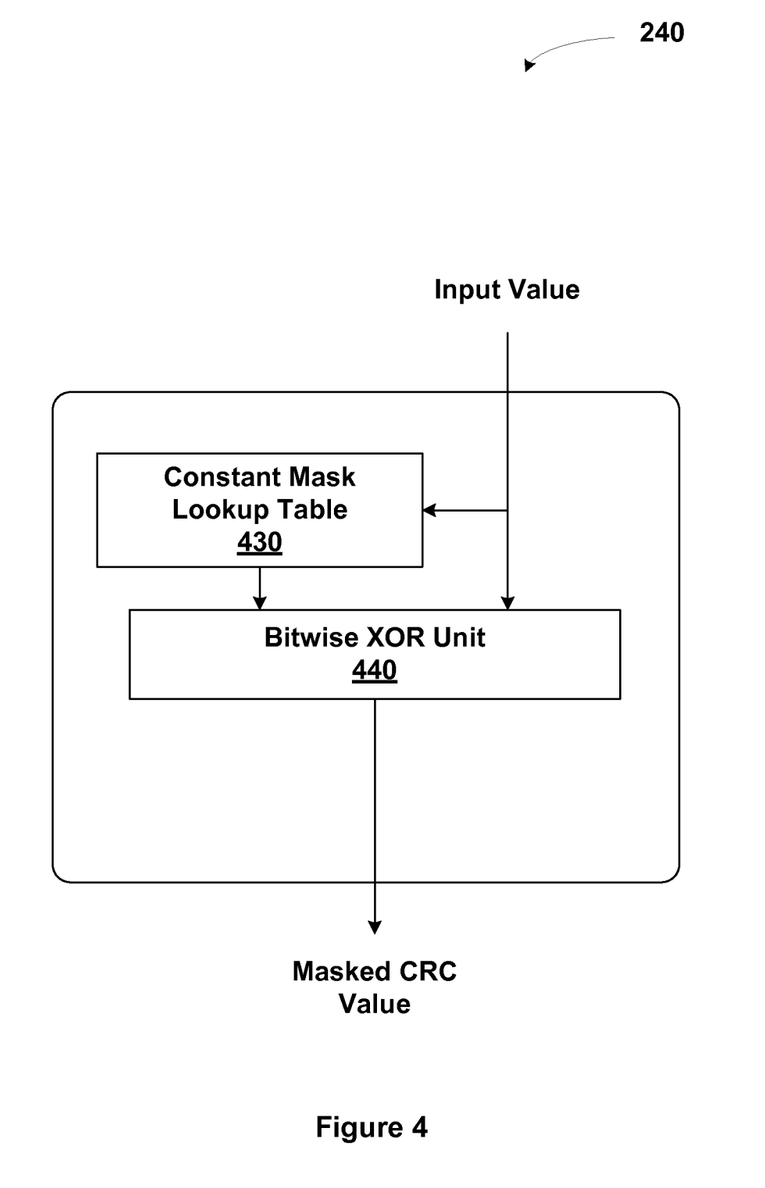
FIG. 4 is a block diagram of the mask and CRC value generator for the CRC value generator of FIG. 2, according to one embodiment of the present invention.

FIG. 4 is a block diagram of the programmable XOR engines 240 for the CRC value generator 200 of FIG. 2, according to one embodiment of the present invention. As shown, the programmable XOR engines 240 include a constant mask lookup table 430, and a bitwise XOR unit 440.

The constant mask lookup table 430 includes pre-calculated CRC values for various fixed portions of the data packet. In some embodiments, certain portions of the CRC value may be pre-calculated and stored in the constant mask lookup table 430. The CRC value generator 200 may then retrieve a pre-calculated CRC value from the constant mask lookup table 430, and merge the pre-calculated value with the running CRC value. Retrieving pre-calculated CRC values may be faster than calculating the CRC value through the partial CRC value generator 350 of FIG. 3.

The bitwise XOR unit 440 is configured to perform an XOR on the input value received from the corresponding multiplexer 205 of FIG. 2 and the value retrieved from the constant mask lookup table 430. Alternatively, the bitwise XOR unit 440 passes one of the two input values to the output of the programmable XOR engine 240. The bitwise XOR unit 440 takes advantage of the associative property of a polynomial LFSR using an XOR tree, where two inputs are of the same length. In such a case, calculating the XOR of two inputs, where each of the two inputs is a partial CRC value from an LFSR, produces the same result as calculating the CRC value of the XOR of the two inputs. Mathematically, this may be expressed as follows:

$$\text{LFSR}(input\_value)\hat{}\text{LFSR}(constant\_mask\_lookup\_table\_value) = \text{LFSR}(input\_value\hat{}constant\_mask\_lookup\_table\_value)$$

The bitwise XOR unit 440 receives an input value and a value retrieved from the constant mask lookup table 430, and provides the masked CRC value at the output of the programmable XOR engine 240.

In one example, the CRC value generator 200 could calculate the CRC value for a specific header type with a given sequence number. The header data for a given data packet would include several fixed fields according to the type of data packet being transmitted. The header data would also include a sequence number as described above in conjunction with FIG. 2. The CRC value for a given header type and sequence number could be pre-calculated and stored in the constant mask lookup table 430, rather than calculated word by word. The CRC value generator 200 would retrieve the CRC value for the header data from the constant mask lookup table 430 based on the header type and sequence number. The CRC value generator 200 would bypass the partial CRC value generator 350 of FIG. 3, resulting in processing efficiency. The bitwise XOR unit 440 would pass the value retrieved from the constant mask lookup table 430 to the output of the programmable XOR engine 240.

In another example, the CRC value generator 200 could calculate the CRC value for one of the data words in the data packet. The input value could be the partial CRC value based on a right-shifted input data value from the partial CRC value logic 210. The partial CRC value would be calculated using leading zeros in the leftmost bits as described above in conjunction with FIG. 2. However, CRC values could be calculated with a starting seed value of all ones. In such a case, the CRC value generator 200 would retrieve the portion of the CRC value associated with a seed value of all ones from the constant mask lookup table 430, based on the number of bits the input data value was shifted by the partial CRC value logic 210. The bitwise XOR unit 440 would perform an XOR on the input value and the value retrieved from the constant mask lookup table 430, and send the result as the output of the programmable XOR engine 240.

By using the techniques described above, CRC values are more efficiently performed. Additional efficiencies are possible in systems where the source device calculates multiple CRC values for each data packet. For example, a protocol could define a link CRC (LCRC) value to ensure integrity of a data packet from a source device to a receiving device across a point-to-point link. The protocol could also define an end-to-end CRC (ECRC) value to ensure integrity of a data packet from a source device to a receiving device as the data packet travels across multiple intervening links. In such a case, each intervening link would calculate and compare the ECRC value to determine that the data packet was successfully received by the intervening link. The receiving device would calculate and compare the LCRC value to determine that the data packet was successfully received by the receiving device. In such a system, the source device may share portions of the CRC value generator between the LCRC value calculation and the ECRC value calculation.

Figure 5:
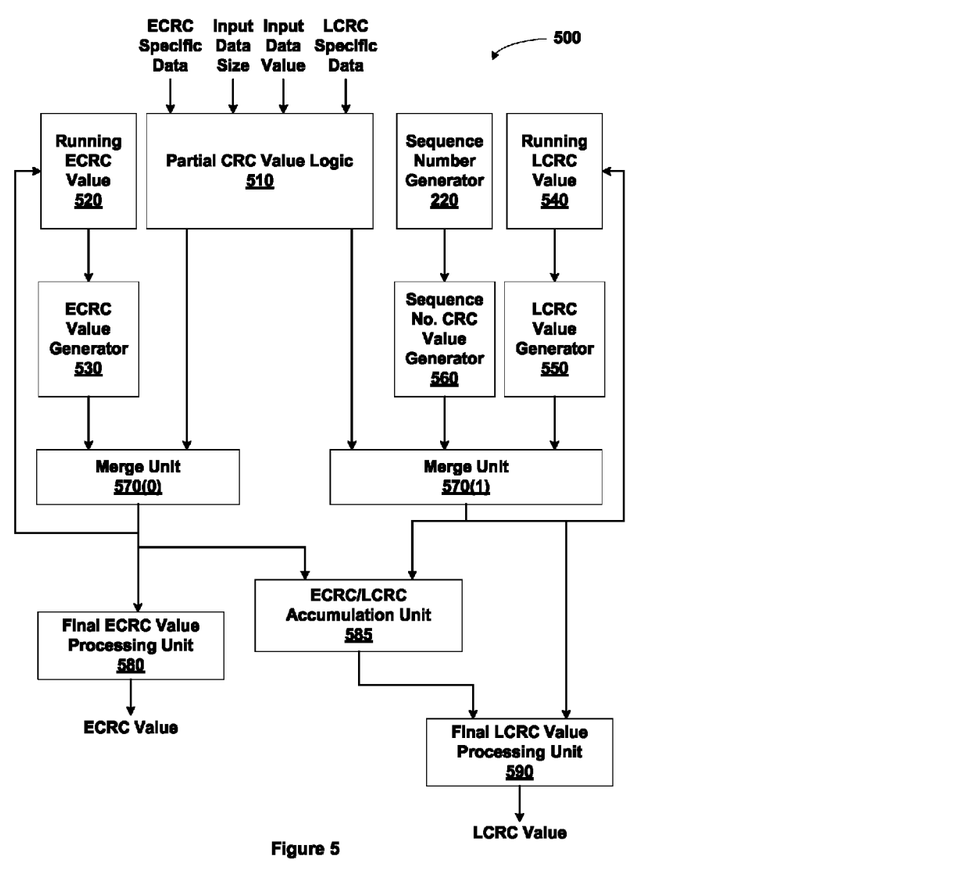
FIG. 5 is a block diagram of an ECRC/LCRC value generator to share an LFSR between link CRC (LCRC) and end-to-end CRC (ECRC) calculations for the CRC value generator of FIG. 2, according to one embodiment of the present invention.

FIG. 5 is a block diagram of an ECRC/LCRC value generator 500 to share an LFSR between link CRC (LCRC) and end-to-end CRC (ECRC) calculations, according to one embodiment of the present invention. As shown, the CRC logic circuit 500 includes partial CRC value logic 510, a sequence number generator 220, a sequence number CRC value generator 560, a running ECRC value 520, an ECRC value generator 530, a running LCRC value 540, an LCRC value generator 550, merge units 570, a final ECRC value processing unit 580, an ECRC/LCRC accumulation unit 585, and a final LCRC value processing unit 590. The partial CRC value logic 510, sequence number generator 220, running ECRC value 520, running LCRC value 540, merge units 570, final ECRC value processing unit 580, and final LCRC value processing unit 590 function substantially equivalently to similarly named components within FIG. 2 except as described below.

The partial CRC value logic 510 calculates partial CRC values on data words associated with a data packet. The partial CRC value logic 510 separately calculates CRC values for ECRC specific data and LCRC specific data. As further described below in conjunction with FIG. 6, the partial CRC value logic 510 combines the partial CRC values associated with the input data, ECRC specific data, and LCRC specific data to produce partial ECRC values and partial LCRC values. The output of the partial CRC value logic 510 is sent to the merge units 570.

The sequence number CRC value generator 560 calculates the CRC value for the current sequence number associated with the data packet. The sequence number CRC value generator 560 is typically a polynomial-based LFSR implemented by techniques known in the art, including, without limitation, a multi-tap shift register, or an array of XOR gates to perform the LFSR calculation as a parallel operation. The output of the sequence number CRC value generator 560 is sent to the merge unit 570(1).

The running ECRC value 520 is a storage register that stores interim ECRC values as the CRC value is being calculated for a given data packet. The running ECRC value 520 receives the output of the merge unit 570(0) and sends an output to the ECRC value generator 530.

The ECRC value generator 530 calculates the CRC value for the running ECRC value 520. The ECRC value generator 530 is typically a polynomial-based LFSR implemented by techniques known in the art, including, without limitation, a multi-tap shift register, or an array of XOR gates to perform the LFSR calculation as a parallel operation. The ECRC value generator 530 receives the running ECRC value 520 as an input and sends an output to the merge unit 570(0).

The running LCRC value 540 is a storage register that stores interim LCRC values as the CRC value is being calculated for a given data packet. The running LCRC value 540 receives the output of the merge unit 570(1) and sends an output to the LCRC value generator 550.

The LCRC value generator 550 calculates the CRC value for the running LCRC value 520. The LCRC value generator 550 is typically a polynomial-based LFSR implemented by techniques known in the art, including, without limitation, a multi-tap shift register, or an array of XOR gates to perform the LFSR calculation as a parallel operation. The LCRC value generator 550 receives the running LCRC value 540 as an input and sends an output to the merge unit 570(1).

The merge units 570 perform additional masking and XOR operations on input values received from other blocks within the CRC value generator 500. Merge unit 570(0) combines the output from the ECRC value generator 530 with the partial ECRC value from the partial CRC value logic 510 and sends the result to the final ECRC value processing unit 580 and to the ECRC/LCRC value accumulation unit. Merge unit 570(1) combines the output from the LCRC value generator 550 with the partial LCRC value from the partial CRC value logic 510 and sends the result to the final LCRC value processing unit 590.

The final ECRC value processing unit 580 completes the last steps for calculating the ECRC value, such as inverting the ECRC bits or reversing the byte order, as defined by the protocol utilized by the bus or second communication channel 113. The final ECRC value processing unit 580 receives the output of the merge unit 570(0) and sends the final ECRC value as an output.

The ECRC/LCRC accumulation unit 585 combines the CRC values from the two merge units 570(0) and 570(1), corresponding to the ECRC value and the LCRC value respectively. In one example, ECRC values and LCRC values could be calculated over different portions of the data packet. The ECRC value would enable an intervening device to ensure the data packet has been accurately received by the intervening device. As such, the ECRC would be calculated over the data words and the ECRC header data, but not over the LCRC header data. Accordingly, the output of the final ECRC value processing unit 580 would include the CRC calculation for the data words and the ECRC specific data only.

The LCRC value would enable the receiving device to ensure the data packet has been accurately received by the receiving device. As such, the LCRC would be calculated over the data words, the LCRC header data, and the ECRC header data. The ECRC/LCRC accumulation unit 585 combines the ECRC value from the merge unit 570(0) and the LCRC value from the merge unit 570(1) to determine the combined LCRC value. The ECRC/LCRC accumulation unit 585 sends the result to the final LCRC value processing unit 590.

The final LCRC value processing unit 590 completes the last steps for calculating the LCRC value, such as inverting the LCRC bits or reversing the byte order, as defined by the protocol utilized by the bus or second communication channel 113. The final LCRC value selects one of two inputs for final processing, depending on whether an ECRC applies to the current data packet. If the current packet is for a point-to-point transfer from a source device to a receiving device without intervening devices, then no ECRC is needed. In such a case, the final LCRC value processing unit 590 selects the output of the merge unit 570(1) for processing. If the current packet is for a point-to-point transfer from a source device to a receiving device routed through intervening devices, then an ECRC is needed. In such a case, the final LCRC value processing unit 590 selects the output of the ECRC/LCRC accumulation unit 585 for processing. The final LCRC value processing unit 590 sends the final LCRC value as an output.

Figure 6:
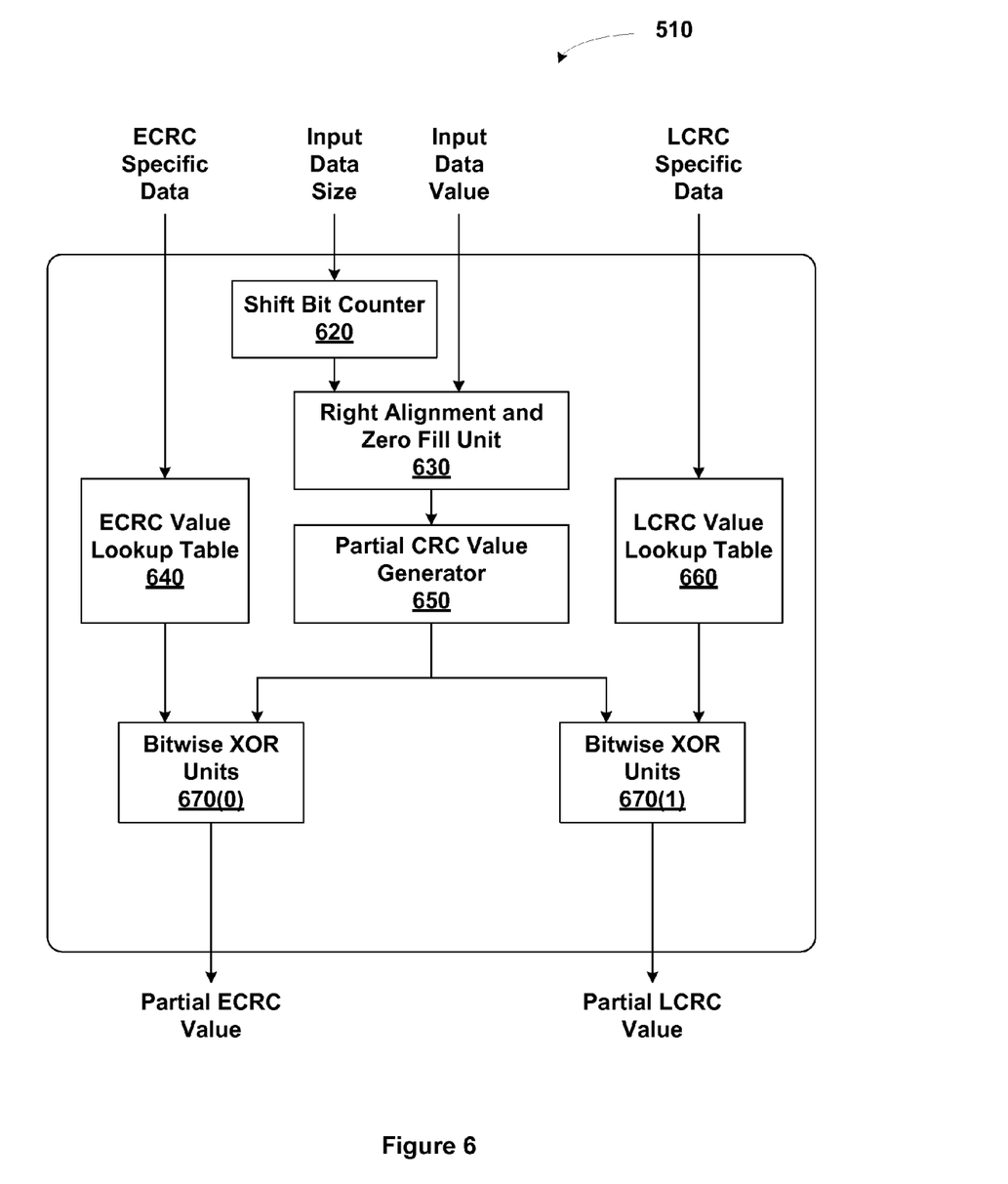
FIG. 6 is a block diagram of the partial CRC value logic for the CRC value generator of FIG. 5 that separates the CRC calculation into two sub-calculations, according to one embodiment of the present invention.

FIG. 6 is a block diagram of the partial CRC value logic 510 for the CRC value generator 500 of FIG. 5, according to one embodiment of the present invention. As shown, the CRC logic circuit 510 logic circuit includes a shift bit counter 620, a right alignment and zero fill unit 630, an ECRC value lookup table 640, an LCRC value lookup table 660, a partial CRC value generator 650, bitwise exclusive or (XOR) units 670, and multiplexers 680. The shift bit counter 620, a right alignment and zero fill unit 630, and partial CRC value generator 650, function substantially equivalently to similarly named components within FIG. 3 except as described below.

The ECRC value lookup table 640 includes pre-calculated ECRC values for various ECRC specific portions of the data packet. In some embodiments, certain portions of the ECRC value may be pre-calculated and stored in the ECRC value lookup table 640, including, without limitation, the portion of the ECRC value associated with the ECRC header data. The ECRC value lookup table 640 receives ECRC specific data, such as the type and size of the data packet. The ECRC specific data is used to select and retrieve the correct entry in the ECRC value lookup table 640. The output of the ECRC value lookup table 640 is sent to the bitwise XOR unit 670(0).

The LCRC value lookup table 660 includes pre-calculated LCRC values for various LCRC specific portions of the data packet. In some embodiments, certain portions of the ECRC value may be pre-calculated and stored in the LCRC value lookup table 640, including, without limitation, the portion of the LCRC value associated with the LCRC header data. The LCRC value lookup table 660 receives LCRC specific data, such as the type and size of the data packet. The LCRC specific data is used to select and retrieve the correct entry in the LCRC value lookup table 660. The output of the LCRC value lookup table 660 is sent to the bitwise XOR unit 670(1).

The partial CRC value generator 650 calculates a CRC value for the input data value, as right-shifted and zero filled by the right alignment and zero fill unit 630. The partial CRC value generator 650 is typically a polynomial-based LFSR implemented by techniques known in the art, including, without limitation, a multi-tap shift register, or an array of XOR gates to perform the LFSR calculation as a parallel operation. The partial CRC value generator 650 receives the output of the right alignment and zero fill unit 630 and send an output to the bitwise exclusive or (XOR) units 670 and the bitwise XOR units 670.

The bitwise exclusive or (XOR) units 670 are configured to perform an XOR on the input value received from the corresponding ECRC specific or the LCRC specific values from the lookup tables 640 660 and the output of the partial CRC value generator 510. Alternatively, the bitwise XOR units 670 pass one of the two input values to the output. The bitwise XOR unit 670(0) and the bitwise XOR unit 670(1) provide the partial ECRC value and the partial LCRC value for the CRC value generator 500, respectively.

In one example, the ECRC/LCRC value generator 500 could calculate the ECRC value and the LCRC value for a specific header type with a given sequence number. The header data for a given data packet would include several fixed fields according to the type of data packet being transmitted. The header data would also include a sequence number as described above in conjunction with FIG. 2. The ECRC value for a given header type and sequence number could be pre-calculated and stored in the ECRC value lookup table 640, rather than calculated word by word. The ECRC/LCRC value generator 500 would retrieve the ECRC value for the header data from the ECRC value lookup table 640 based on the header type and sequence number. The bitwise XOR unit 670(0) would pass the value retrieved from the ECRC value lookup table 640 to the output of the partial CRC value logic 510. Likewise, the LCRC value for a given header type and sequence number could be pre-calculated and stored in the LCRC value lookup table 660, rather than calculated word by word. The ECRC/LCRC value generator 500 would retrieve the LCRC value for the header data from the LCRC value lookup table 660 based on the header type and sequence number. The bitwise XOR unit 670(1) would pass the value retrieved from the LCRC value lookup table 660 to the output of the partial CRC value logic 510.

In another example, the ECRC/LCRC value generator 500 could calculate the CRC value for one of the data words in the data packet. The input value could be the partial CRC value based on a right-shifted input data value from the partial CRC value logic 650. The partial CRC value would be calculated using leading zeros in the leftmost bits as described above in conjunction with FIG. 2. However, CRC values could be calculated with a starting seed value of all ones. In such a case, the ECRC/LCRC value generator 500 would retrieve the portion of the ECRC value associated with a seed value of all ones from the ECRC value lookup table 640, based on the number of bits the input data value was shifted by the right alignment and zero fill unit 630. The bitwise XOR unit 670(0) would perform an XOR on the output of the partial CRC value generator 650 and the value retrieved from the ECRC value lookup table 640, and send the result as the output of the programmable XOR engine 670(0). Likewise, the ECRC/LCRC value generator 500 would retrieve the portion of the LCRC value associated a seed value of all ones from the LCRC value lookup table 660, based on the number of bits the input data value was shifted by the right alignment and zero fill unit 630. The bitwise XOR unit 670(1) would perform an XOR on the output of the partial CRC value generator 650 and the value retrieved from the LCRC value lookup table 660, and send the result as the output of the programmable XOR engine 670(1).

Some protocols provide for a source device to share the bus or second communication channel 113 across multiple communication links. In such a case, the ECRC/LCRC value generator 500 may be time multiplexed among the multiple communication links, resulting in improved efficiency.

Figure 7:
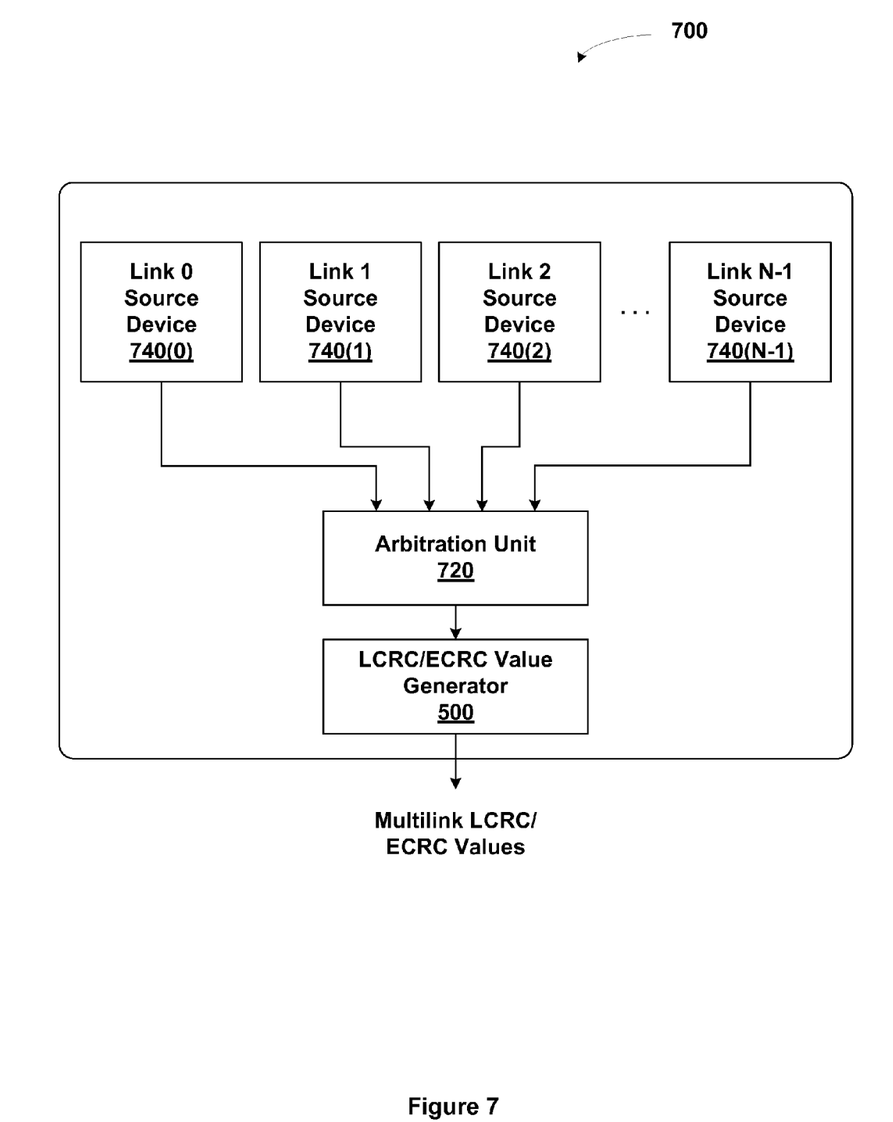
FIG. 7 is a block diagram of system 700 for time-multiplexing the ECRC/LCRC value generator of FIG. 5 across multiple links, according to one embodiment of the present invention.

FIG. 7 is a block diagram of a system 700 for time-multiplexing the ECRC/LCRC value generator 500 of FIG. 5 across multiple links, according to one embodiment of the present invention. As shown, the system 700 includes an LCRC/ECRC value generator 500, link source devices 740, and an arbitration unit 720. The ECRC/LCRC value generator 500 functions substantially the same as described in conjunction with FIG. 5.

The link source devices 740 are various devices configured to share the bus or second communication channel 113. A given system may include up to N link source devices, represented by link 0 source device through link N−1 source device 740(N−1). Typically, each of the link source devices 740 are configured to calculate LCRC and ECRC values for the data packets sent by each of the link source devices 740. When a link source device 740 has a data packet ready for transmission, the link source device 740 sends a request to the arbitration unit 720. When the arbitration unit 720 grants access to the link source device 740, the link source device transmits the data packet to the arbitration unit.

The arbitration unit 720 determines which one or more of the link source devices has access to the ECRC/LCRC value generator 500 at a particular time. The arbitration unit receives requests from link source devices 740 that have data packets ready to be transmitted to the bus or second communication channel 113. The arbitration unit 720 grants access to one of the link source devices 740. The arbitration unit 720 may employ any technically feasible arbitration technique as is known in the art, including, without limitation, round robin techniques, priority-driven approaches, and random selection. The link source device 740 receiving the grant then transmits the data packet which the arbitration unit 720 retransmits to the ECRC/LCRC value generator 500. When the CRC values have been calculated by the ECRC/LCRC value generator 500 as described above, the data packet is sent to the bus or second communication channel 113. The arbitration unit 720 is then free to assign the ECRC/LCRC value generator 500 to another request link source device 740.

It will be appreciated that the architecture described herein is illustrative only and that variations and modifications are possible. For example, the CRC calculated using the techniques described herein could be customized for a particular system or could be defined according to a specific protocol, including, without limitation, PCI Express, Universal Serial Bus (USB), IEEE 802.3, or Serial AT Attachment (SATA). In another example, the system 700 is described in the context of time-multiplexing the ECRC/LCRC value generator 500 of FIG. 5 across multiple links. Such a system 700 may be utilized to time multiplex other CRC value generators, including, without limitation, the CRC value generator 200 of FIG. 2.

Figure 8A:
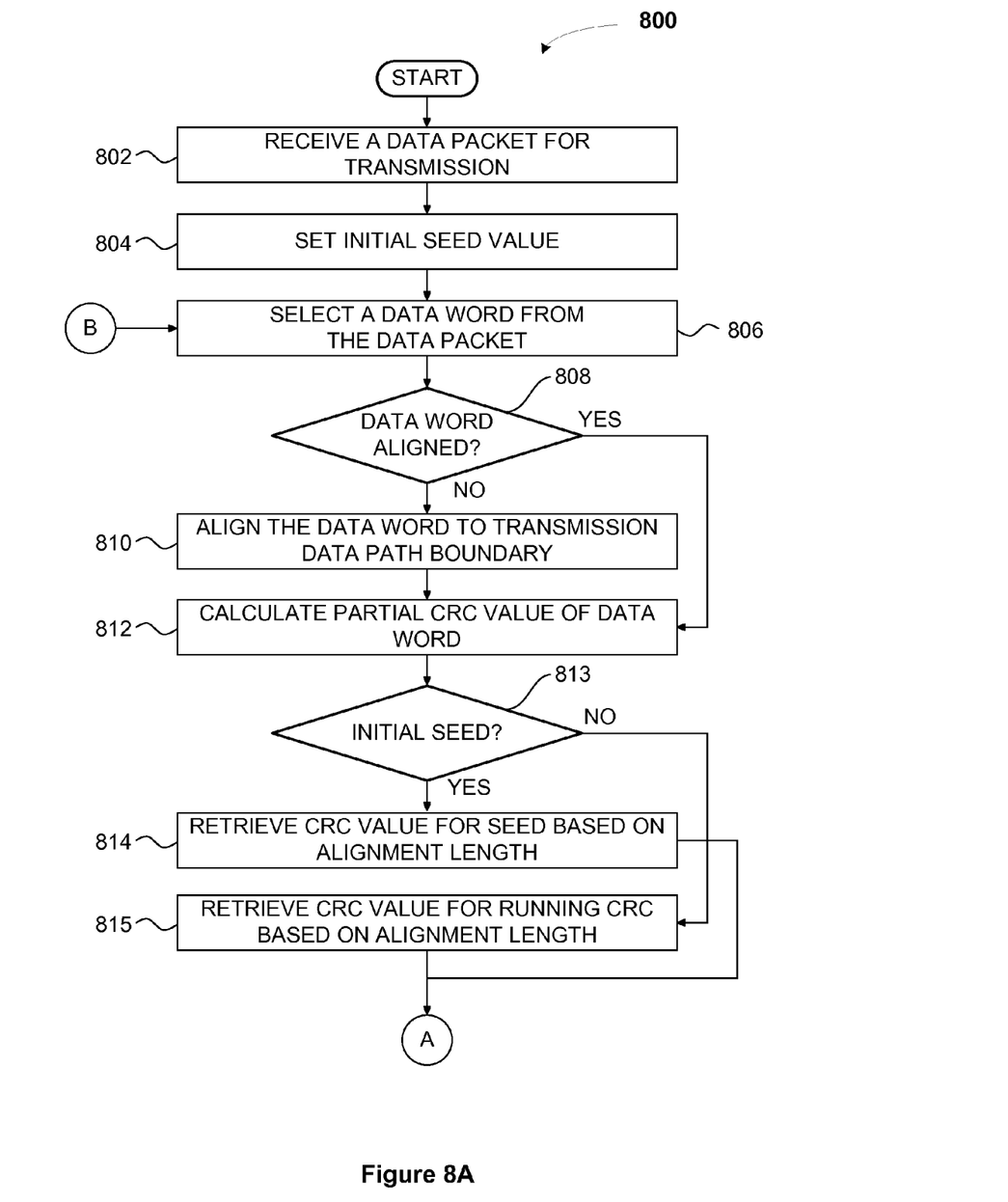
FIGS. 8A and 8B set forth a flow diagram of method steps for generating CRC values, according to one embodiment of the present invention.
Figure 8B:
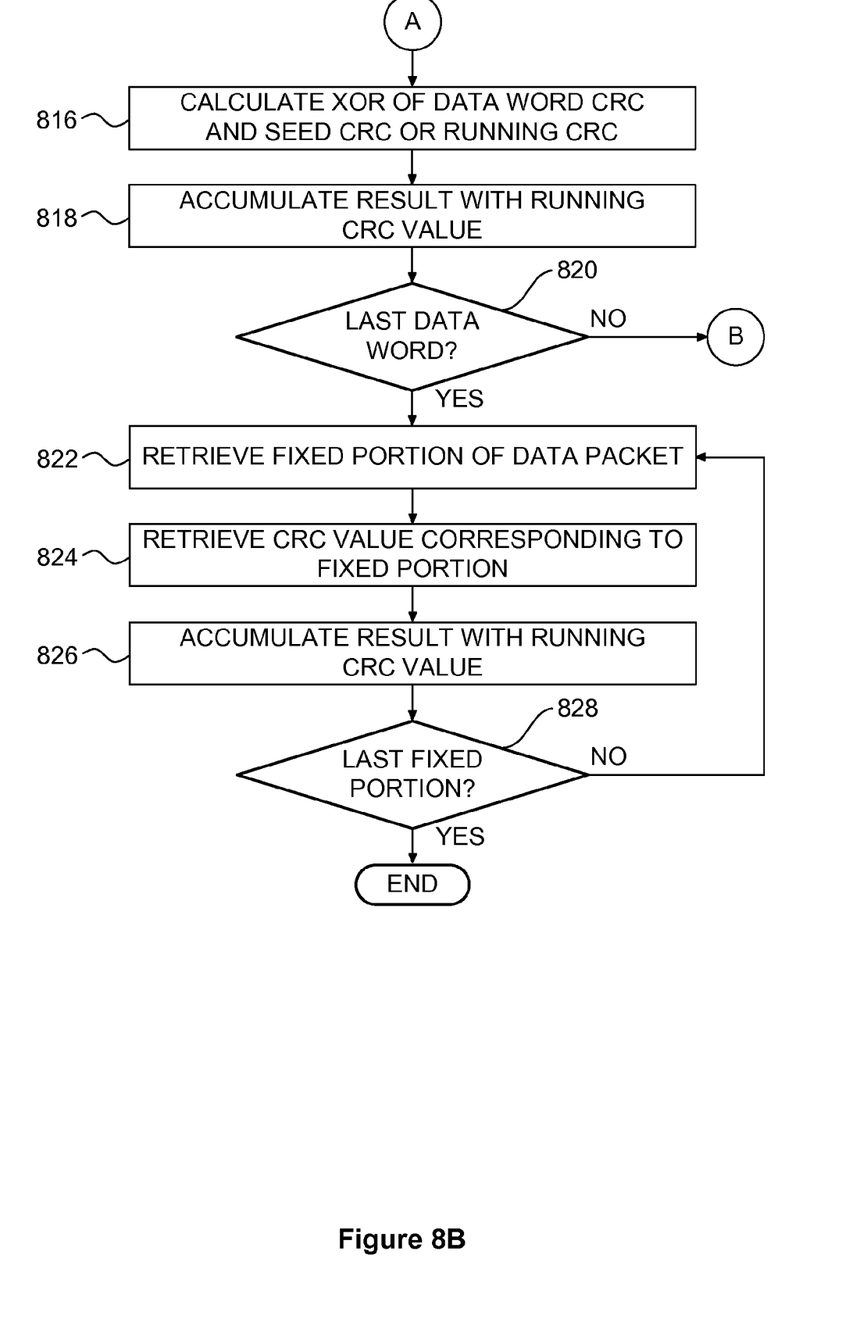

FIGS. 8A and 8B set forth a flow diagram of method steps for generating CRC values, according to one embodiment of the present invention. Although the method steps are described in conjunction with FIGS. 1-7, persons skilled in the art will understand that any system configured to perform the method steps, in any order, falls within the scope of the present invention.

The method 800 begins at step 802, where the CRC value generator receives a data packet for transmission to the bus or second communication channel 113. At step 804, the CRC value generator sets an initial seed value, such as a value of all one's. At step 806, the CRC value generator selects a data word from the data packet. At step 808, the CRC value generator determines whether the data word is right-aligned to the data path of the CRC value generator. If the data word is not right-aligned to the data path, then the method 800 proceeds to step 810, where the CRC value generator aligns the data word to the right of the transmission data path boundary. The CRC value generator fills the non-significant leftmost bits of the data word with zero. At step 812, the CRC value generator calculates the partial CRC value of the right-aligned data word.

At step 813, the CRC value generator determines whether the selected data word is an initial seed value. If the selected data word is an initial seed value, then the method 800 proceeds to step 814, where the CRC value generator retrieves the CRC value associated with the seed value from a lookup table, based on the data word length and on the number of bit shifts required to right-align the data word. If, at step 813, the selected data word is not an initial seed value, then the method 800 proceeds to step 815, where the CRC value generator retrieves the CRC value associated with the running CRC value, based on the data word length and on the number of bit shifts required to right-align the data word.

From either step 814 or step 815, the method 800 then proceeds to step 816, where the CRC value generator calculates the XOR of the data word partial CRC value calculated in step 812 with either the CRC value associated with the seed value retrieved in step 814 or the CRC value associated with the running CRC value retrieved in step 815. In step 818, the CRC value generator accumulates the result of the XOR operation with the running CRC value for the data packet.

At step 820, the CRC value generator determines whether the last data word in the packet has been processed. If the last data word has not been processed, then the method 800 proceeds to step 806, described above. If the last data word has been processed, then the method 800 proceeds to step 822, where the CRC value generator retrieves a fixed portion of the data packet. For example, the CRC value generator could retrieve information that the data packet is of a certain type, and that the header would include a sequence number as determined by the sequence number generator. At step 824, the CRC value generator retrieves a CRC value corresponding to the fixed portion of the data packet. At step 826, the CRC value generator accumulates the retrieved CRC value with the running CRC value. At step 828, the CRC value generator determines whether the last fixed portion of the data packet has been processed. If the last fixed portion of the data packet has not been processed, then the method 800 proceeds to step 822, described above. If the last fixed portion of the data packet has been processed, then the method 800 terminates.

Returning to step 808, if the data word is right-aligned to the data path, then the method 800 proceeds to step 812, described above.

Certain steps of the method 800 may be repeated in cases where the CRC value generator calculates multiple CRC values. In one example, the CRC value generator could calculate LCRC and ECRC values for each data packet. Steps 806 through 820 would be performed once to calculate the CRC value associated with the data words in the packet. Steps 822 through 828 would be performed twice, once to calculate the LCRC value and once to calculate the ECRC value.

In addition, the method 800 could be repeated to calculate CRC values for multiple communication links that share the bus or second communication channel 113. In such cases, the method 800 is repeated for each link that has a data packet ready for transmission to the bus or second communication channel 113.

In sum, cyclic redundancy check (CRC) values are efficiently calculated using an improved linear feedback shift register (LFSR) circuit. CRC value generation is separated into two sub-calculations, where each sub-calculation is performed separately using a smaller LFSR circuit relative to conventional circuit designs. The results from the two sub-calculations are then combined to form a final CRC value. In this approach, a programmable XOR engine performs logic functions via a table lookup rather than via a more complex random logic circuit. LCRC and ECRC calculations are performed using a single shared LFSR circuit rather than separate and distinct LFSR circuits. Multiple links share the same CRC value generator.

Advantageously, CRC values are generated using smaller and fewer LFSR circuits relative to conventional circuit designs. As a result, a CRC value generator utilizing the disclosed techniques consumes less surface area of an integrated circuit and consumes less power, resulting in cooler operation. Smaller LFSR circuits may also exhibit reduced latency, resulting in higher speed performance when calculating CRC values. The programmable XOR engine is flexibly modified with additional table lookup values. As a result, design verification and testing are simplified relative to conventional circuit designs.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense. Therefore, the scope of embodiments of the present invention is set forth in the claims that follow.

What is claimed is:

1. A computer-implemented method for generating cyclic redundancy check (CRC) values, comprising:
    selecting a first data word from a plurality of data words associated with a data packet;
    determining a first partial CRC value for the first data word based on an initial seed value of zero;
    retrieving a second partial CRC value for a first predetermined non-zero seed value based on the number of bits within the first data word, wherein the second partial CRC value is stored in a lookup table; and performing an operation on the first partial CRC value and the second partial CRC value to determine a first composite CRC value.

2. The method of claim 1, further comprising setting all bits within the first predetermined non-zero seed value to a value of one.

3. The method of claim 1, wherein the operation comprises an exclusive or (XOR) operation.

4. The method of claim 1, further comprising:
determining that the first data word includes a number of significant bits that is less than the number of bits within the first data word;
right-shifting the first data word by a first number of bit positions until the significant bits occupy the rightmost bit positions of the first data word; and
setting a second number of leftmost bit positions of the first data word to zero, wherein the first number is equal to the second number.

5. The method of claim 4, wherein the second partial CRC value is further based on the first number.

6. The method of claim 1, wherein determining the second partial CRC value comprises retrieving the second partial CRC value from a lookup table within a storage device.

7. The method of claim 1, further comprising:
selecting a second data word from the plurality of data words associated with the data packet;
determining a third partial CRC value for the second data word based on an initial seed value of zero;
determining a fourth partial CRC value for a second predetermined non-zero seed value based on the number of bits within the second data word;
performing an operation on the third partial CRC value and the fourth partial CRC value to determine a second composite CRC value; and
combining the first composite CRC value and the second composite CRC value to determine a third composite CRC value.

8. The method of claim 7, further comprising:
determining a fourth composite CRC value for a predetermined fixed portion of the data packet based on a type associated with the data packet; and
combining the third composite CRC value and the fourth composite CRC value to determine a first final CRC value.

9. The method of claim 8, wherein the fourth composite CRC value is further based on a sequence number that increments after the data packet is transmitted.

10. The method of claim 8, further comprising:
determining a fifth composite CRC value for a predetermined fixed portion of the data packet based on a type associated with the data packet; and
combining the third composite CRC value and the fifth composite CRC value to determine a second final CRC value.

11. A subsystem comprising:
a CRC value generator configured to generate cyclic redundancy check (CRC) values by performing the steps of:
selecting a first data word from a plurality of data words associated with a data packet;
determining a first partial CRC value for the first data word based on an initial seed value of zero;
retrieving a second partial CRC value for a first predetermined non-zero seed value based on the number of bits within the first data word, wherein the second partial CRC value is stored in a lookup table; and
performing an operation on the first partial CRC value and the second partial CRC value to determine a first composite CRC value.

12. The subsystem of claim 11, wherein the CRC value generator is further configured to perform the step of setting all bits within the first predetermined non-zero seed value to a value of one.

13. The subsystem of claim 11, wherein the operation comprises an exclusive or (XOR) operation.

14. The subsystem of claim 11, wherein the CRC value generator is further configured to perform the steps of:
determining that the first data word includes a number of significant bits that is less than the number of bits within the first data word;
right-shifting the first data word by a first number of bit positions until the significant bits occupy the rightmost bit positions of the first data word; and
setting a second number of leftmost bit positions of the first data word to zero, wherein the first number is equal to the second number.

15. The subsystem of claim 14, wherein the second partial CRC value is further based on the first number.

16. The subsystem of claim 11, wherein determining the second partial CRC value comprises retrieving the second partial CRC value from a lookup table within a storage device.

17. The subsystem of claim 11, wherein the CRC value generator is further configured to perform the steps of:
selecting a second data word from the plurality of data words associated with the data packet;
determining a third partial CRC value for the second data word based on an initial seed value of zero;
determining a fourth partial CRC value for a second predetermined non-zero seed value based on the number of bits within the second data word;
performing an operation on the third partial CRC value and the fourth partial CRC value to determine a second composite CRC value; and
combining the first composite CRC value and the second composite CRC value to determine a third composite CRC value.

18. The subsystem of claim 17, wherein the CRC value generator is further configured to perform the steps of:
determining a fourth composite CRC value for a predetermined fixed portion of the data packet based on a type associated with the data packet; and
combining the third composite CRC value and the fourth composite CRC value to determine a first final CRC value.

19. The subsystem of claim 18, wherein the CRC value generator is further configured to perform the steps of:
determining a fifth composite CRC value for a predetermined fixed portion of the data packet based on a type associated with the data packet; and
combining the third composite CRC value and the fifth composite CRC value to determine a second final CRC value.

20. A system for generating cyclic redundancy check (CRC) values comprising:
a CRC value generator; and
a memory coupled to the CRC value generator, wherein the memory includes an application program that includes instructions that, when executed by the CRC value generator, cause the CRC value generator to perform the steps of:
selecting a first data word from a plurality of data words associated with a data packet;

determining a first partial CRC value for the first data word based on an initial seed value of zero;
retrieving a second partial CRC value for a first predetermined non-zero seed value based on the number of bits within the first data word, wherein the second partial CRC value is stored in a lookup table; and
performing an operation on the first partial CRC value and the second partial CRC value to determine a first composite CRC value.

* * * * *